(12) United States Patent
Abe et al.

(10) Patent No.: US 11,876,529 B2
(45) Date of Patent: Jan. 16, 2024

(54) CURRENT OUTPUT MODULE

(71) Applicant: Yokogawa Electric Corporation, Tokyo (JP)

(72) Inventors: Taisuke Abe, Musashino (JP); Takeki Satou, Musashino (JP); Takumi Sakurai, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 159 days.

(21) Appl. No.: 17/677,503

(22) Filed: Feb. 22, 2022

(65) Prior Publication Data

US 2022/0291704 A1 Sep. 15, 2022

(30) Foreign Application Priority Data

Mar. 15, 2021 (JP) ................. 2021-041471

(51) Int. Cl.
*H03M 1/10* (2006.01)
*H03M 1/66* (2006.01)
*H03M 1/12* (2006.01)
*H03M 1/06* (2006.01)

(52) U.S. Cl.
CPC ............. *H03M 1/66* (2013.01); *H03M 1/12* (2013.01); *H03M 1/06* (2013.01); *H03M 1/10* (2013.01)

(58) Field of Classification Search
CPC ............ H03M 1/66; H03M 1/12; H03M 1/06; H03M 1/10
See application file for complete search history.

(56) References Cited

U.S. PATENT DOCUMENTS

| | | | |
|---|---|---|---|
| 5,351,009 | A | 9/1994 | Hutch |
| 2009/0121908 | A1 | 5/2009 | Regier |
| 2010/0149007 | A1 | 6/2010 | Zushi et al. |
| 2019/0238124 | A1 | 8/2019 | Tajima |
| 2020/0081465 | A1* | 3/2020 | Hurwitz .................. H03F 3/343 |

FOREIGN PATENT DOCUMENTS

| | | |
|---|---|---|
| JP | 2003-111487 A | 4/2003 |
| JP | 2010-141807 | 6/2010 |
| JP | 2019-132618 | 8/2019 |

* cited by examiner

*Primary Examiner* — Joseph J Lauture
(74) *Attorney, Agent, or Firm* — RANKIN, HILL & CLARK LLP

(57) ABSTRACT

A current output module includes a current output section configured to output a current, an AD conversion circuit configured to convert a detection voltage, which is a voltage according to the current output from the current output section, into a digital value, a controller configured to control a current output from the current output section on the basis of the digital value of the detection voltage output from the AD conversion circuit, and a reference voltage generator configured to generate a plurality of reference voltages. The controller includes a processor configured to cause the AD conversion circuit to convert each of the plurality of reference voltages into a digital value, and a corrector configured to calibrate the AD conversion circuit on the basis of each digital value obtained by conversion of the plurality of reference voltages.

15 Claims, 5 Drawing Sheets

CURRENT OUTPUT MODULE

BACKGROUND

Field of the Invention

The present invention relates to a current output module. Priority is claimed on Japanese Patent Application No. 2021-041471, filed on Mar. 15, 2021, the contents of which are incorporated herein by reference.

Description of Related Art

Conventionally, a current output module that outputs a desired current to a load by detecting a current output to the load and performing feedback control so that the detected current matches a target value has been developed. For example, in a plant, a current output module is used to supply a current of 4 to 20 mA to a field device as a load. Japanese Unexamined Patent Application Publication No. 2003-111487 discloses a current control device that does not use a field device as a load, but detects a current flowing through a linear solenoid, and feeds back energization to the linear solenoid so that a detected value of the current matches the target value.

Incidentally, in the current output module described above, it is inspected whether a current according to the target value is output, and when the current according to the target value is not output, calibration is generally performed before shipping. However, when the ambient temperature changes or an error of an analog circuit occurs due to a change over time, an error will occur in a current output from the current output module. In order to prevent such an error, it is necessary for the current output module to calibrate the analog circuit even after it is shipped out. It is desirable that such calibration be performed automatically even while the current output module is operated.

SUMMARY

A current output module may include: a current output section configured to output a current; an AD conversion circuit configured to convert a detection voltage, which is a voltage according to the current output from the current output section, into a digital value; a controller configured to control a current output from the current output section on the basis of the digital value of the detection voltage output from the AD conversion circuit; and a reference voltage generator configured to generate a plurality of reference voltages. The controller may include: a processor configured to cause the AD conversion circuit to convert each of the plurality of reference voltages into a digital value; and a corrector configured to calibrate the AD conversion circuit on the basis of each digital value obtained by conversion of the plurality of reference voltages.

Further features and aspects of the present disclosure will become apparent from the following detailed description of exemplary embodiments with reference to the attached drawings.

DETAILED DESCRIPTION OF THE INVENTION

Figure 1:
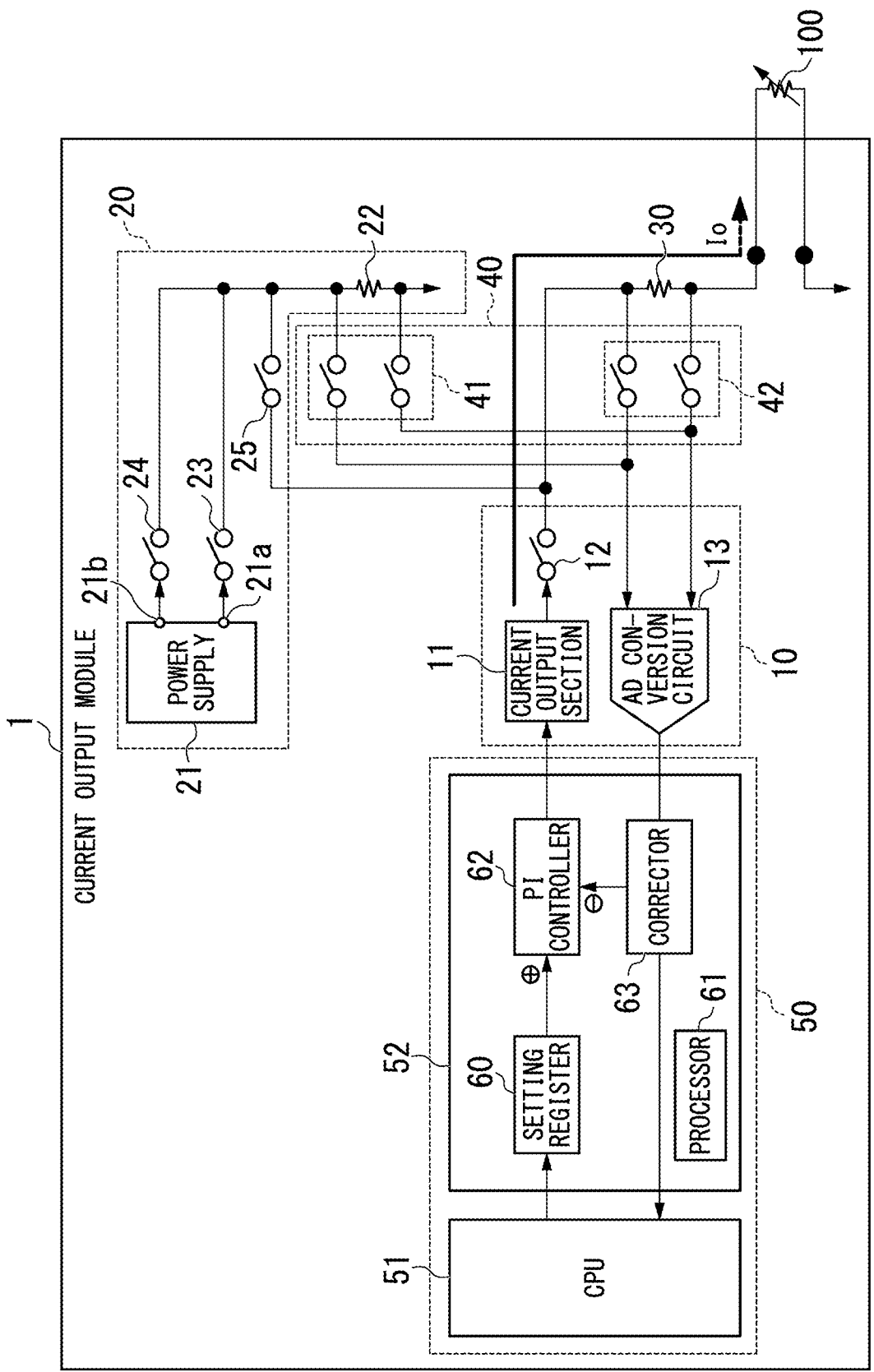
FIG. 1 is a block diagram which shows a main configuration of a current output module according to a first embodiment.

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide a current output module capable of automatically performing calibration even after shipment.

Hereinafter, a current output module according to an embodiment of the present invention will be described in detail with reference to the drawings. In the following description, an outline of the embodiment of the present invention will be described first, and details of each embodiment of the present invention will be subsequently described.

[Outline]

The embodiment of the present invention makes it possible to calibrate an analog circuit even after shipment in the current output module. Specifically, it is possible to sequentially correct a conversion error of an AD conversion circuit caused by an influence of temperature and the like in the analog circuit in the current output module.

A current output module is attached to a device such as a programmable logic control (PLC) or a data logger to capture an analog signal (a measurement signal) from a measurement target or to output an analog signal to a control target. For example, the current output module includes an analog circuit that has a current output section for outputting an output current and an AD conversion circuit for converting a detection voltage, which is a voltage according to an output current output from the current output section, into a digital value.

For example, the current output module controls the output current output from the current output section at a constant level so that the digital value obtained by conversion by the AD conversion circuit becomes a set value. Here, in the current output module, an analog circuit of the AD conversion circuit is calibrated at the time of shipment, but the calibration may not be performed after the shipment. In addition, since calibration during shipment is performed at room temperature, if an ambient temperature changes from room temperature after shipment, a conversion error of the AD conversion circuit will occur. For this reason, the digital value may deviate from the set value, and the current output module may not be able to control the output current output from the current output section at a constant level, or may not be able to output an output current of a target value.

In addition, since not only the AD conversion circuit but also the current output section may be affected by the ambient temperature, when PI control of the output current is not implemented, the output current output from the current output section may fluctuate from the target value in some cases.

In the embodiments of the present invention, the current output module includes a reference voltage generator that generates a plurality of reference voltages, and each of the plurality of reference voltages is converted into a digital value by the AD conversion circuit. Then, the current output module calibrates the AD conversion circuit on the basis of each digital value obtained by the conversion of the plurality of reference voltage values. As a result, it possible to automatically calibrate the analog circuit even after shipment.

In addition, in the embodiments of the present invention, after the calibration of the AD conversion circuit, an output current according to a preset calibration voltage is output from the current output section, and the current output section is calibrated on the basis of a digital value obtained from the AD conversion circuit. As a result, not only the AD conversion circuit but also the current output section can be automatically calibrated after shipment.

Moreover, in the embodiments of the present invention, since the calibration of the analog circuit can be sequentially implemented, the calibration at the time of shipment is unnecessary, and a workload related to the calibration at the time of shipment can be reduced.

First Embodiment

FIG. 1 is a block diagram which shows a main configuration of a current output module 1 of a first embodiment. As shown in FIG. 1, the current output module 1 includes, for example, an analog circuit 10, a reference voltage generator 20, a reference resistor 30, a switching section 40, and a controller 50. "Connection" described below is electrical connection. Electrical connection means that electric power or electric signals can be transmitted directly or indirectly. The electrical connection may be a connection through components such as cables, resistors, capacitors, diodes, switches and the like.

The analog circuit 10 includes, for example, a current output section 11, a first switch 12, and an analog to digital (AD) conversion circuit 13.

The current output section 11 outputs a constant output current Io. For example, the current output section 11 outputs the output current Io between 4 mA and 20 mA to a load 100 on the basis of a control signal from the controller 50. The current output section 11 is configured by, for example, an operational amplifier or a transistor. The current output section 11 is connected to the load 100 via the reference resistor 30. The output current Io is supplied to the load 100 via the reference resistor 30. The load 100 is, for example, an electronic device such as a field device. The field device may be, for example, a vortex flow meter, a temperature sensor, a valve device such as a flow control valve or an on-off valve, an actuator device such as a fan or a motor, or another device installed on site at a plant.

The first switch 12 is connected between an output of the current output section 11 and the reference resistor 30. For example, the first switch 12 has one end connected to the current output section 11 and the other end connected to the reference resistor 30. The first switch 12 is controlled to be in an on state or an off state by the controller 50.

The AD conversion circuit 13 converts an input analog value into a digital value (hereinafter referred to as "AD conversion"). The AD conversion circuit 13 outputs an AD-converted digital value to the controller 50. For example, the AD conversion circuit 13 converts a detection voltage, which is a voltage according to the output current Io output from the current output section 11, into a digital value. In addition to an AD converter, which has a function for performing AD conversion, the AD conversion circuit 13 may include a conversion circuit for converting a voltage level input to the AD converter, a differential circuit for preventing leakage, and the like.

The reference voltage generator 20 generates a plurality of reference voltages V1 and V2. As shown in FIG. 1, the reference voltage generator 20 includes, for example, a power supply 21, a reference resistor 22, a second switch 23, a third switch 24, and a fourth switch 25.

The power supply 21 applies one of the reference voltage V1 and the reference voltage V2 to the reference resistor 22. For example, the power supply 21 includes an output terminal 21a and an output terminal 21b. The output terminal 21a is connected to one end of the reference resistor 22 via the second switch 23. The output terminal 21b is connected to one end of the reference resistor 22 via the third switch 24. The other end of the reference resistor 22 is connected to a ground (GND). The power supply 21 generates the reference voltage V1 in the reference resistor 22 by outputting a current from the output terminal 21a. The power supply 21 generates the reference voltage V2 in the reference resistor 22 by outputting a current from the output terminal 21b.

The reference resistor 22 is, for example, a resistor having a low resistance tolerance and a high-precision resistor having little fluctuation in resistance value due to a temperature change.

The fourth switch 25 is connected between one end of the reference resistor 22 and the output of the current output section 11. For example, the fourth switch 25 has one end connected to one end of the reference resistor 22 and the other end connected to the other end of the first switch 12.

The reference resistor 30 converts the output current Io into a detection voltage. The reference resistor 30 is connected between the output of the current output section 11 and the load 100. For example, reference resistor 30 is a shunt resistor for monitoring the output current Io.

The switching section 40 switches an analog value input to the AD conversion circuit 13 to one of a reference voltage (reference voltage V1 or V2) and a detection voltage. For example, the switching section 40 includes a fifth switch 41 and a sixth switch 42.

The fifth switch 41 switches a connection between both ends of the reference resistor 22 and an input of the AD conversion circuit 13 to an on state or off state. The sixth switch 42 switches the connection between both ends of the reference resistor 30 and the input of the AD conversion circuit 13 to the on state or off state.

In the switching section 40, the fifth switch 41 is controlled to be in the on state and the sixth switch 42 is controlled to be in the off state, and thereby the analog value input to the AD conversion circuit 13 is switched to a reference voltage. In the switching section 40, the fifth switch 41 is controlled to be in the off state and the sixth switch 42 is controlled to be in the on state, and thereby the analog value input to the AD conversion circuit 13 is switched to a detection voltage.

The controller 50 controls the output current Io output from the current output section 11 on the basis of a digital value of a detection voltage output from the AD conversion circuit 13. The controller 50 has a function of calibrating the AD conversion circuit 13.

As shown in FIG. 1, the controller 50 includes a CPU 51 and a logic control circuit 52. The logic control circuit 52 includes a setting register 60, a processor 61, a PI controller 62, and a corrector 63.

The CPU 51 writes a target value in the setting register 60. This target value is a voltage value for maintaining the output current Io at a target current, and is, for example, a target value of a detection voltage of the reference resistor 30.

The processor 61 converts each of the plurality of reference voltages V1 and V2 into a digital value by the AD conversion circuit 13. The processor 61 controls the switching section 40 to perform control of one of a first state in which an analog value input to the AD conversion circuit 13 is a reference voltage or a second state in which this analog value is a detection voltage.

For example, the processor 61 controls generation of the reference voltages V1 and V2 by the reference voltage generator 20. The processor 61 controls the on state and off state of each of the first switch 12, the second switch 23, the third switch 24, and the fourth switch 25.

The PI controller 62 PI controls the output current Io such that an error ΔV between the digital value of the detection voltage obtained from the AD conversion circuit 13 and the target value written in the setting register 60 is eliminated. For example, the PI controller 62 outputs a control signal according to the error ΔV to the current output section 11. The current output section 11 outputs the output current Io according to this control signal.

The corrector 63 calibrates the AD conversion circuit 13 on the basis of each digital value of the plurality of reference voltage values V1 and V2 converted by the AD conversion circuit 13. For example, corrector 63 calculates a correction formula for eliminating a conversion error of the AD conversion circuit 13 on the basis of each voltage value (ideal value) of the preset reference voltage values V1 and V2 and each digital value of a plurality of reference voltages. Then, the corrector 63 calibrates the AD conversion circuit 13 by correcting the digital value of a detection voltage output from the AD conversion circuit 13 to the PI controller 62 on the basis of the calculated correction formula.

In the following description, a calibration method of the AD conversion circuit 13 according to the first embodiment will be described.

When the corrector 63 acquires the digital values of the plurality of reference voltages V1 and V2 from the AD conversion circuit 13, the corrector 63 obtains the conversion error of the AD conversion circuit 13. For example, the reference voltage generator 20 generates the reference voltage V1 at both ends of the reference resistor 22 by allowing a current I1 to flow from the power supply 21 to the reference resistor 22, and generates the reference voltage V2 (>V1) at both ends of the reference resistor 22 by allowing a current I2 to flow from the power supply 21 to the reference resistor 22. Here, the ideal value of the reference voltage V1 is set to Vr1, and the digital value of the reference voltage V1 AD-converted by the AD conversion circuit 13 is set to Vd1. The ideal value of the reference voltage V2 is set to Vr2, and the digital value of the reference voltage V2 AD-converted by the AD conversion circuit 13 is set to Vd2.

Figure 2:
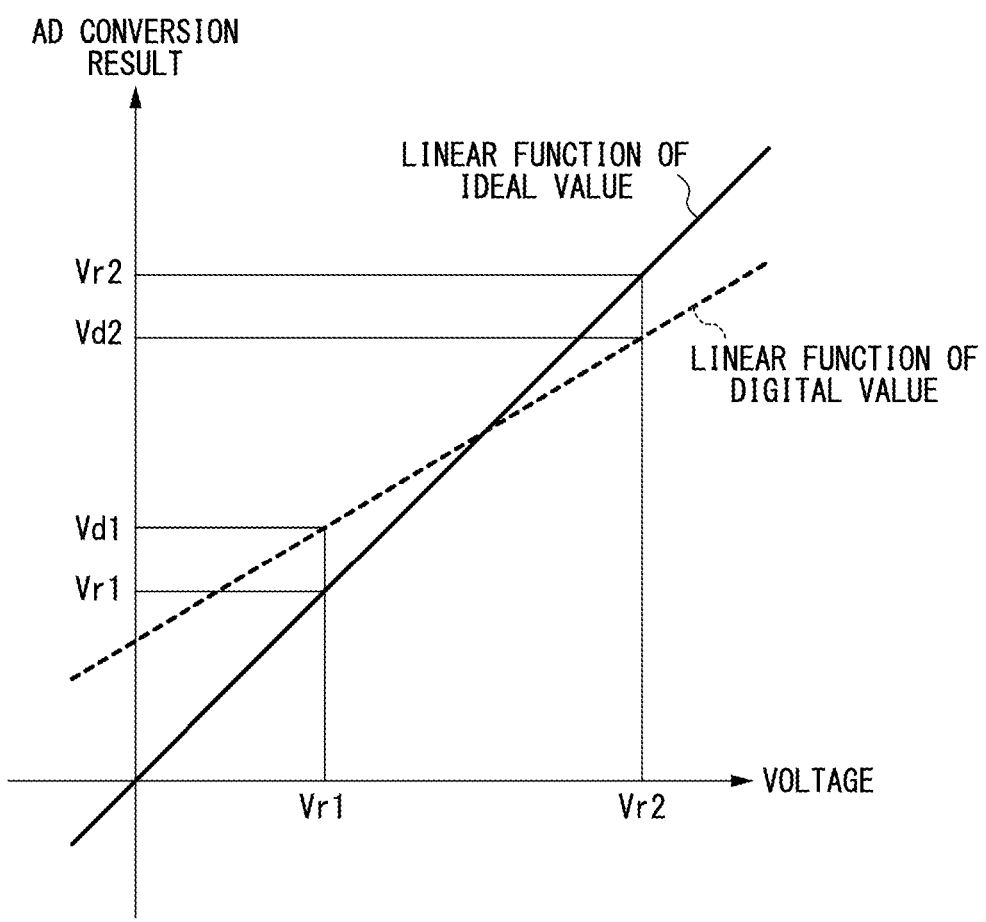
FIG. 2 is a diagram which describes a calibration method of an AD conversion circuit according to the first embodiment.

The corrector 63 obtains a correction formula for correcting the digital value of AD conversion circuit 13 to the ideal value on the basis of the ideal values Vr1, the ideal value Vr2, the digital value Vd1, and the digital value Vd2. For example, an ideal value of a reference voltage and a digital value of the reference voltage are represented by a linear function as shown in FIG. 2. First, the corrector 63 obtains a slope Aideal and an intercept Bideal of the linear function of the ideal value of the reference voltage by using the following equations (1) and (2).

[Math. 1]
$$A_{ideal} = \frac{Vr2 - Vr1}{Vr2 - Vr1} = 1 \quad (1)$$

[Math. 2]
$$B_{ideal} = Vr1 - A_{ideal} \times Vr1 = 0 \quad (2)$$

The corrector 63 obtains a slope Ameas and an intercept Bmeas of the linear function of the digital value of the reference voltage using the following equations (3) and (4).

[Math. 3]
$$A_{meas} = \frac{Vd2 - Vd1}{Vr2 - Vr1} \quad (3)$$

[Math. 4]
$$B_{meas} = Vd1 - A_{meas} \times Vr1 \quad (4)$$

The corrector 63 obtains a correction coefficient Aadj and a correction coefficient Badj on the basis of the following equations (5) and (6).

[Math. 5]
$$A_{adj} = \frac{A_{ideal}}{A_{meas}} \quad (5)$$

[Math. 6]
$$B_{adj} = B_{ideal} - A_{adj} \cdot B_{meas} \quad (6)$$

The corrector 63 obtains a correction formula for correcting a result of the conversion by the AD conversion circuit 13 from the following equation (7) on the basis of the correction coefficient Aadj and the correction coefficient Badj.

[Math. 7]
$$\text{AD conversion result}_{adj} = A_{adj} \times \text{Actual AD conversion result} + B_{adj} \quad (7)$$

The corrector 63 performs correction by substituting a result of the AD conversion (an actual result of the AD conversion) obtained by the AD conversion circuit 13 into Equation (7), and obtains a result adj of the AD conversion after the correction. The corrector 63 outputs the result adj of the AD conversion to the PI controller 62.

Figure 3:
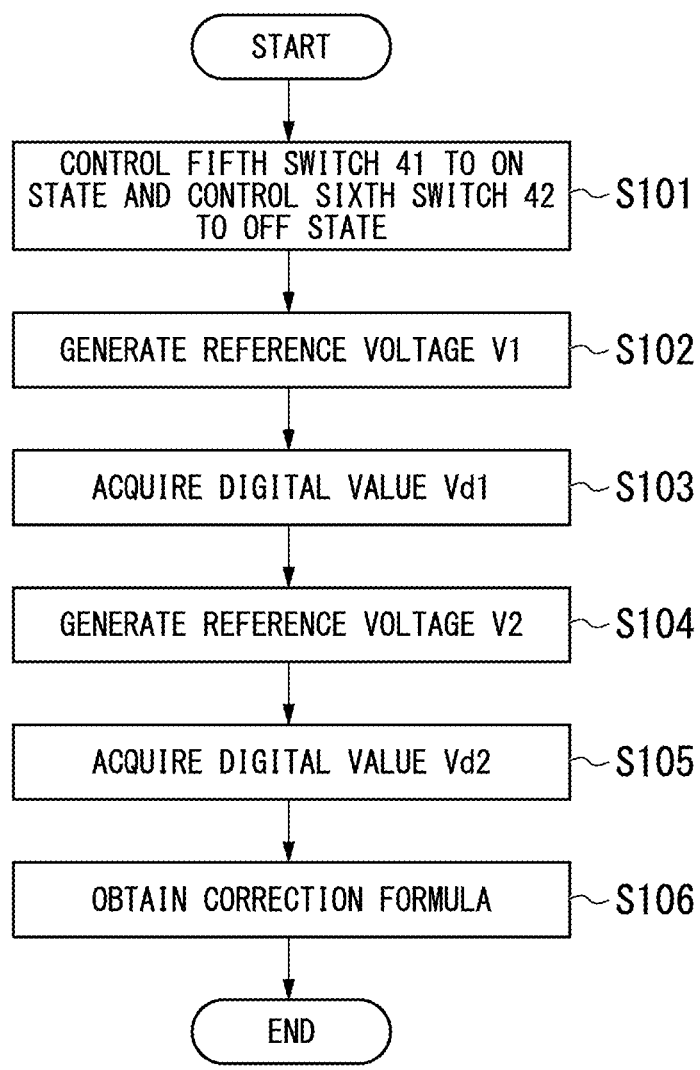
FIG. 3 is a flowchart of calibration processing of an analog circuit according to the first embodiment.

Next, a flow of the calibration method of the AD conversion circuit 13 according to the first embodiment will be described with reference to FIG. 3. FIG. 3 is a flowchart of the calibration method of the AD conversion circuit 13 according to the first embodiment.

The processor 61 controls the first state, that is, a state in which the fifth switch 41 is in the on state, and switches an analog value input to the AD conversion circuit 13 to a reference voltage by controlling the sixth switch 42 to be in the off state (step S101). The processor 61 controls the fourth switch 25 to be in the off state. In this state, the processor 61 controls the second switch 23 to be in the on state, controls the third switch 24 to be in the off state, and generates the reference voltage V1 in the reference resistor 22 by causing the power supply 21 to output a current from the output terminal 21a (step S102).

When the reference voltage V1 is generated in the reference resistor 22, the AD conversion circuit 13 reads the reference voltage V1 and acquires the digital value Vd1 by performing AD conversion on the read reference voltage V1 (step S103). The AD conversion circuit 13 outputs the digital value Vd1 to the corrector 63.

The processor 61 controls the second switch 23 to be in the off state, controls the third switch 24 to be in the on state, and generates the reference voltage V2 in the reference resistor 22 by causing the power supply 21 to output a current from the output terminal 21b (step S104). When the reference voltage V2 is generated in the reference resistor 22, the AD conversion circuit 13 reads the reference voltage V2 and AD-converts the read reference voltage V2 to acquire the digital value Vd2 (step S105). The AD conversion circuit 13 outputs the digital value Vd2 to the corrector 63.

The corrector 63 obtains the correction formula for correcting the digital value of the AD conversion circuit 13 to the ideal value on the basis of the ideal value Vr1, the ideal value Vr2, the digital value Vd1, and the digital value Vd2 (step S106). As a result, the current output module 1 ends the calibration of the AD conversion circuit 13. Therefore, after the calibration of the AD conversion circuit 13, the processor 61 controls the switching section 40, and switches the analog value input to the AD conversion circuit 13 to the detection voltage by controlling the fifth switch 41 to be in the off state and controlling the sixth switch 42 to be in the on state. Then, the corrector 63 corrects the digital value of the detection voltage that is AD-converted by the AD conversion circuit 13 on the basis of the obtained correction formula, and outputs the corrected digital value to the PI controller 62.

The current output module 1 may output the output current Io to the load 100 during the calibration of the AD conversion circuit 13.

As described above, the current output module 1 of the present embodiment converts each of the plurality of reference voltages into digital values using the AD conversion circuit 13, and calibrates the AD conversion circuit 13 on the basis of each digital value obtained by converting the plurality of reference voltage values. As a result, the calibration of the analog circuit 10 can be automatically performed even after the shipment.

Moreover, the current output module 1 includes a reference voltage generator 20 to calibrate the AD conversion circuit 13. As a result, the current output module 1 can automatically perform calibration without stopping an output to the load 100.

Second Embodiment

Figure 4:
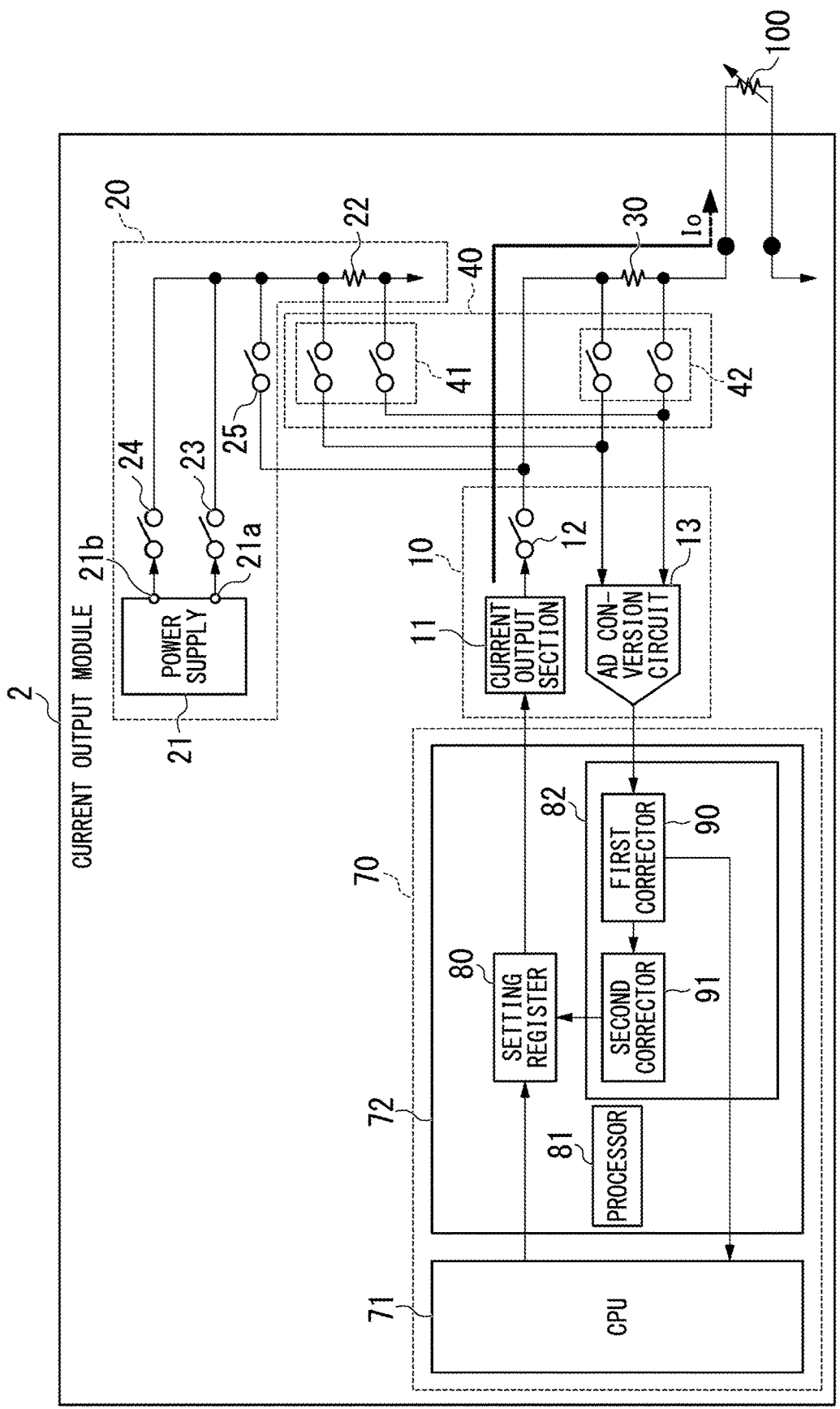
FIG. 4 is a block diagram which shows a main configuration of a current output module according to a second embodiment.

FIG. 4 is a block diagram which shows a main configuration of a current output module 2 according to a second embodiment of the present invention. In FIG. 4, constituents similar to those shown in FIG. 1 will be denoted by the same reference numerals. As shown in FIG. 4, the current output module 2 of the present embodiment has a configuration in which a function of calibrating the current output section 11 is added as compared with the current output module 1 shown in FIG. 1.

Here, since the current output module 1 of the first embodiment described above performs the PI control of the output current Io, it is not necessary to calibrate the current output section 11. However, when the PI control of the output current Io is not performed, an error in the current output section 11 is not corrected. The current output module 2 of the present embodiment is set to be capable of automatically calibrating an analog circuit even after shipment by calibrating the AD conversion circuit 13 and calibrating the current output section 11.

The current output module 2 includes, for example, the analog circuit 10, the reference voltage generator 20, the reference resistor 30, the switching section 40, and a controller 70. The controller 70 controls the output current Io output from the current output section 11 on the basis of the digital value of a detection voltage output from the AD conversion circuit 13. The controller 70 has a function of calibrating the AD conversion circuit 13 and calibrating the current output section 11.

As shown in FIG. 4, the controller 70 includes a CPU 71 and a logic control circuit 72. The logic control circuit 72 includes a setting register 80, a processor 81, and a corrector 82.

The CPU 71 writes a set voltage to be applied to the reference resistor 22 in the setting register 80. This set voltage is a voltage value for maintaining the output current Io at a target current, and is, for example, a target value of a detection voltage of the reference resistor 30.

The processor 81 has a similar function to the processor 61, and converts each of the plurality of reference voltages V1 and V2 into digital values using the AD conversion circuit 13. The processor 81 controls the switching section 40 to one of a first state in which an analog value input to the AD conversion circuit 13 is a reference voltage and a second state in which the analog value is a detection voltage.

When the current output section 11 is calibrated, the processor 81 outputs each of calibration currents, which are output currents according to preset calibration voltages V3 and V4, from the current output section 11 to the reference resistor 22, and causes the AD conversion circuit 13 to convert a detection voltage generated in the reference resistor 22 by the calibration current into a digital value. The calibration voltage V3 may be the same as the reference voltage V1 or may be a different voltage. The calibration voltage V4 may be the same as the reference voltage V2 or may be a different voltage.

The corrector 82 includes a first corrector 90 and a second corrector 91.

The first corrector 90 has a similar function to the corrector 63, and calibrates the AD conversion circuit 13 in a similar method to that described in the first embodiment.

The second corrector 91 calibrates the current output section 11. The second corrector 91 calibrates the current output section 11 on the basis of digital values of a plurality of detection voltages generated in the reference resistor 22 by the calibration currents and voltage values (ideal values) of the plurality of calibration voltages V3 and V4. For example, the second corrector 91 corrects the set voltage stored in the setting register 80 on the basis of the digital values of the plurality of detection voltages and the voltage values (ideal values) of the plurality of calibration voltages.

Since the calibration method of the AD conversion circuit 13 according to the second embodiment is the same as that of the first embodiment, the description thereof will be omitted. In the following description, the calibration method of the current output section 11 according to the second embodiment will be described. For example, the calibration of the current output section 11 is executed after the calibration of the AD conversion circuit 13 is performed.

The current output section 11 generates a detection voltage Vk3 at both ends of the reference resistor 22 by allowing a calibration current Ic3 to flow through the reference resistor 22 to generate the calibration voltage V3 in the reference resistor 22. The current output section 11 generates a detection voltage Vk4 at both ends of the reference resistor 22 by allowing a calibration current Ic4 to flow through the reference resistor 22 to generate the calibration voltage V4 in the reference resistor 22. Here, an ideal value of the calibration voltage V3 is set to Vr3, and a digital value of the detection voltage Vk3 that is AD-converted by the AD conversion circuit 13 is set to Vd3. An ideal value of the calibration voltage V4 is set to Vr4, and a digital value of the detection voltage Vk4 that is AD-converted by the AD conversion circuit 13 is set to Vd4.

Here, since the AD conversion circuit 13 has already been calibrated, an error included in the digital value Vd3 and the digital value Vd4 is only the error of the current output section 11. That is, the digital value Vd3 and the digital value Vd4 do not include the error of the AD conversion circuit 13. The second corrector 91 obtains a correction formula for correcting the set voltage stored in the setting register 80 on the basis of the ideal values Vr3 and Vr4 and the digital values Vd3 and Vd4. For example, errors $ZERO_{err}$ and $SPAN_{err}$ of the current output section 11 are represented by the following equations.

[Math. 8]
$$zero_{err} = Vd3 - Vr3 \qquad (8)$$

[Math. 9]
$$SPAN_{err} = Vd4 - Vr4 \qquad (9)$$

Therefore, it is necessary to set REGzero shown below as the set voltage to generate the ideal value Vr3 of the calibration voltage V3 in the reference resistor 22, and to set the set voltage to REGspan shown below to generate the ideal value Vr4 of the calibration voltage V4 in the reference resistor 22.

[Math. 10]
$$REG_{zero} = Vr3 - zero_{err} \qquad (10)$$

[Math. 11]
$$REG_{span} = Vr4 - span_{err} \qquad (11)$$

The second corrector 91 obtains the correction formula shown in Equation (14) by obtaining a slope of a correction value shown in Equation (12) and an intercept shown in Equation (13) from REGzero and REGspan.

[Math. 12]
$$A_{meas\_cal} = \frac{REG_{sapn} - REG_{zero}}{Vr4 - Vr3} \qquad (12)$$

[Math. 13]
$$B_{meas\_cal} = REG_{zero} - A_{meas\_cal} \times Vr3 \qquad (13)$$

[Math. 14]
$$\text{Set value after correction} = \qquad (14)$$
$$A_{meas\_cal} \times \text{Set value before correction} + B_{meas\_cal}$$

The second corrector 91 obtains Equation (14) and corrects the set voltage stored in the setting register 80, thereby ending the calibration of the current output section 11.

Figure 5:
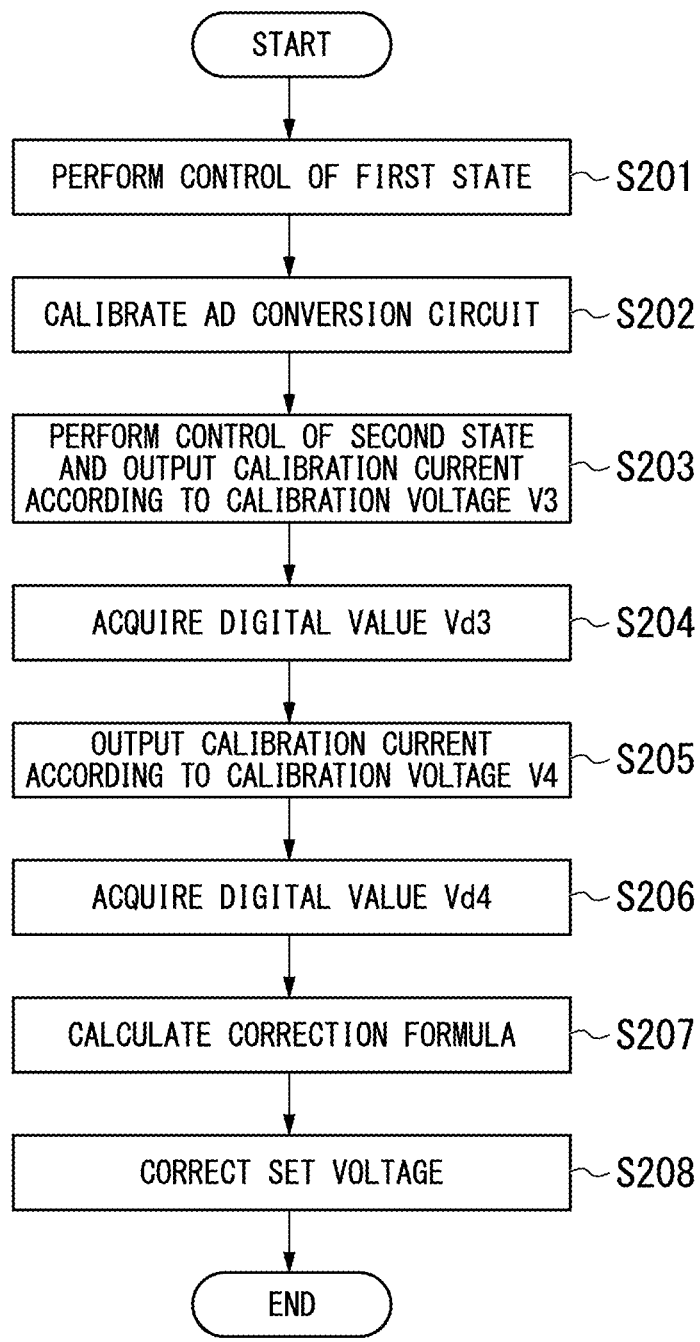
FIG. 5 is a flowchart of the calibration processing of the analog circuit according to the first embodiment.

Next, the flow of the calibration method of an analog circuit according to the second embodiment will be described with reference to FIG. 5. FIG. 5 is a flowchart of the calibration method of an analog circuit according to the second embodiment.

The processor 61 controls the switching section 40 to be in the first state (step S201). The corrector 82 calibrates the AD conversion circuit 13 in the first state (step S202). When the calibration of the AD conversion circuit 13 is completed, the processor 61 controls the first state to be in the second state and outputs a calibration current according to the calibration voltage V3 from the current output section 11 (step S203). The AD conversion circuit 13 reads a detection voltage and acquires the digital value Vd3 by AD converting the read detection voltage (step S204).

The processor 61 outputs a calibration current according to the calibration voltage V4 from the current output section 11 (step S205). The AD conversion circuit 13 reads a detection voltage and acquires the digital value Vd4 by AD converting the read detection voltage (step S206).

The corrector 82 obtains a correction formula for correcting the error in the current output section 11 on the basis of the ideal value Vr3, the ideal value Vr4, the digital value Vd3, and the digital value Vd4 (step S207). The corrector 82 corrects the set voltage stored in the setting register 80 on the basis of the obtained correction formula (step S208). As a result, an accurate value is made to be applied to the reference resistor 22.

As described above, the current output module 2 of the present embodiment has a similar effect to that of the first embodiment, and can automatically calibrate the error of the current output section 11.

Although the current output module according to the embodiments of the present invention has been described above, the present invention is not limited to the embodiments described above and can be freely changed within the scope of the present invention. For example, the reference voltage V1 and the calibration voltage V3 may be a ground voltage (0V).

In addition, a resistance value of the reference resistor 22 and a resistance value of the reference resistor 30 may be the same value or different values.

Moreover, in the current output module 1 of the first embodiment and the current output module 2 of the second embodiment, the output current Io may be supplied to the load 100 during the calibration of an analog circuit. When it is not necessary to supply the output current Io to the load 100, the reference voltage V1 and the reference voltage V2 may be applied to the reference resistor 30 instead of the reference resistor 22 when the AD conversion circuit 13 is calibrated.

[Supplementary Note]

A current output module according to one aspect of the present invention may include a current output section configured to output a current, an AD conversion circuit configured to convert a detection voltage, which is a voltage according to the current output from the current output section, into a digital value, a controller configured to control a current output from the current output section on the basis of the digital value of the detection voltage output from the AD conversion circuit, and a reference voltage generator configured to generate a plurality of reference voltages. The controller may include a processor configured to cause the AD conversion circuit to convert each of the plurality of reference voltages into a digital value, and a corrector configured to calibrate the AD conversion circuit on the basis of each digital value obtained by conversion of the plurality of reference voltages.

In addition, in the current output module according to the aspect of the present invention, the corrector may be configured to, using each voltage value of the plurality of reference voltages and each digital value of the plurality of reference voltages, calibrate the AD conversion circuit by correcting the digital value of the detection voltage on the basis of a correction formula for eliminating a conversion error of the AD conversion circuit.

In addition, in the current output module according to the aspect of the present invention, the controller may further include a PT controller configured to control a current output from the current output section in order to eliminate an error between the digital value of the detection voltage corrected according to the correction formula and a preset target value.

In addition, the current output module according to the aspect of the present invention may further include a reference resistor configured to convert the current output from the current output section into the detection voltage. The processor may be configured to output a calibration current, which is a current according to a preset calibration voltage, from the current output section to the reference resistor, and cause the AD conversion circuit to convert the detection voltage generated in the reference resistor by the calibration current into the digital value. The corrector may be configured to calibrate the current output section on the basis of a digital value of the detection voltage generated in the reference resistor by the calibration current and a voltage value of the calibration voltage.

In addition, the current output module according to the embodiment of the present invention may further include a switching section configured to switch an analog value input to the AD conversion circuit into one of the reference voltage and the detection voltage. The processor may be configured to control the switching section to be in one of a first state in which the analog value is the reference voltage and a second state in which the analog value is the detection voltage.

In addition, in the current output module according to the embodiment of the present invention, the processor may be configured to perform control of the second state after control of the first state. The corrector may be configured to calibrate the AD conversion circuit in the first state, and calibrate the current output section on the basis of the voltage value of the calibration voltage and the digital value of the detection voltage obtained in the second state.

In addition, in the current output module according to the embodiment of the present invention, the controller may include a setting register configured to store a set voltage to be applied to the reference resistor. The current output section may be configured to output a current according to the set voltage stored in the setting register to the reference resistor. The corrector may be configured to correct the set voltage stored in the setting register on the basis of the voltage value of the calibration voltage and the digital value of the detection voltage obtained in the second state.

In addition, in the current output module according to the embodiment of the present invention, the reference voltage generator may be configured to generate a first reference voltage and a second reference voltage which higher than the first reference voltage. The processor may be configured to convert the first reference voltage into a first digital value by the AD conversion circuit, and convert the second reference voltage into a second digital value by the AD conversion circuit.

In addition, in the current output module according to the embodiment of the present invention, the corrector may be configured to calculate a first correction formula for eliminating a conversion error of the AD conversion circuit on the basis of an ideal value of the first reference voltage, an ideal value of the second reference voltage, the first digital value, and the second digital value.

In addition, in the current output module according to the embodiment of the present invention, the current output section may be configured to generate a first detection voltage at both ends of the reference resistor by allowing a first calibration current to flow through the reference resistor to generate a first calibration voltage in the reference resistor, and generate a second detection voltage at both ends of the reference resistor by allowing a second calibration current to flow through the reference resistor to generate a second calibration voltage in the reference resistor. The processor may be configured to convert the first detection voltage into a third digital value by the AD conversion circuit, and convert the second detection voltage into a fourth digital value by the AD conversion circuit.

In addition, in the current output module according to the embodiment of the present invention, the corrector may be configured to calculate a second correction formula for calibrating the current output section on the basis of an ideal value of the first calibration voltage, an ideal value of the second calibration voltage, the third digital value, and the fourth digital value.

In addition, in the current output module according to the embodiment of the present invention, the corrector may be configured to calibrate the current output section after the AD conversion circuit is calibrated.

In addition, in the current output module according to the embodiment of the present invention, the current output section may be connected to a load via the reference resistor.

In addition, in the current output module according to the embodiment of the present invention, the current output section may be configured to output the current to the load during a calibration of the AD conversion circuit.

In addition, in the current output module according to the embodiment of the present invention, the load may be a field device installed in a plant.

As described above, according to the present invention, it is possible to automatically calibrate an analog circuit even after shipment.

As used herein, the following directional terms "front, back, above, downward, right, left, vertical, horizontal, below, transverse, row and column" as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A current output module comprising:
a current output section configured to output a current;
an AD conversion circuit configured to convert a detection voltage, which is a voltage according to the current output from the current output section, into a digital value;
a controller configured to control a current output from the current output section on the basis of the digital value of the detection voltage output from the AD conversion circuit; and
a reference voltage generator configured to generate a plurality of reference voltages,
wherein the controller comprises:
a processor configured to cause the AD conversion circuit to convert each of the plurality of reference voltages into a digital value; and
a corrector configured to calibrate the AD conversion circuit on the basis of each digital value obtained by conversion of the plurality of reference voltages.

2. The current output module according to claim 1,
wherein the corrector is configured to, using each voltage value of the plurality of reference voltages and each digital value of the plurality of reference voltages, calibrate the AD conversion circuit by correcting the digital value of the detection voltage on the basis of a correction formula for eliminating a conversion error of the AD conversion circuit.

3. The current output module according to claim 2,
wherein the controller further comprises a PI controller configured to control a current output from the current output section in order to eliminate an error between the digital value of the detection voltage corrected according to the correction formula and a preset target value.

4. The current output module according to claim 1, further comprising:
a reference resistor configured to convert the current output from the current output section into the detection voltage,
wherein the processor is configured to:
output a calibration current, which is a current according to a preset calibration voltage, from the current output section to the reference resistor; and
cause the AD conversion circuit to convert the detection voltage generated in the reference resistor by the calibration current into the digital value, and
wherein the corrector is configured to calibrate the current output section on the basis of a digital value of the detection voltage generated in the reference resistor by the calibration current and a voltage value of the calibration voltage.

5. The current output module according to claim 4, further comprising:
a switching section configured to switch an analog value input to the AD conversion circuit into one of the reference voltage and the detection voltage,
wherein the processor is configured to control the switching section to be in one of a first state in which the analog value is the reference voltage and a second state in which the analog value is the detection voltage.

6. The current output module according to claim 5,
wherein the processor is configured to perform control of the second state after control of the first state, and
wherein the corrector is configured to:
calibrate the AD conversion circuit in the first state; and
calibrate the current output section on the basis of the voltage value of the calibration voltage and the digital value of the detection voltage obtained in the second state.

7. The current output module according to claim 5,
wherein the controller comprises a setting register configured to store a set voltage to be applied to the reference resistor,
wherein the current output section is configured to output a current according to the set voltage stored in the setting register to the reference resistor, and
wherein the corrector is configured to correct the set voltage stored in the setting register on the basis of the voltage value of the calibration voltage and the digital value of the detection voltage obtained in the second state.

8. The current output module according to claim 4,
wherein the current output section is configured to:
generate a first detection voltage at both ends of the reference resistor by allowing a first calibration current to flow through the reference resistor to generate a first calibration voltage in the reference resistor; and
generate a second detection voltage at both ends of the reference resistor by allowing a second calibration current to flow through the reference resistor to generate a second calibration voltage in the reference resistor, and
wherein the processor is configured to:
convert the first detection voltage into a third digital value by the AD conversion circuit; and
convert the second detection voltage into a fourth digital value by the AD conversion circuit.

9. The current output module according to claim 8,
wherein the corrector is configured to calculate a second correction formula for calibrating the current output section on the basis of an ideal value of the first calibration voltage, an ideal value of the second calibration voltage, the third digital value, and the fourth digital value.

10. The current output module according to claim 9,
wherein the corrector is configured to calibrate the current output section after the AD conversion circuit is calibrated.

11. The current output module according to claim 1,
wherein the reference voltage generator is configured to generate a first reference voltage and a second reference voltage which higher than the first reference voltage, and
wherein the processor is configured to:
convert the first reference voltage into a first digital value by the AD conversion circuit; and
convert the second reference voltage into a second digital value by the AD conversion circuit.

12. The current output module according to claim 11, wherein the corrector is configured to calculate a first correction formula for eliminating a conversion error of the AD conversion circuit on the basis of an ideal value of the first reference voltage, an ideal value of the second reference voltage, the first digital value, and the second digital value.

13. The current output module according to claim 1, wherein the current output section is connected to a load via the reference resistor.

14. The current output module according to claim 13, wherein the current output section is configured to output the current to the load during a calibration of the AD conversion circuit.

15. The current output module according to claim 13, wherein the load is a field device installed in a plant.

\* \* \* \* \*